(12) United States Patent
Buchwalter et al.

(10) Patent No.: US 6,919,420 B2
(45) Date of Patent: Jul. 19, 2005

(54) ACID-CLEAVABLE ACETAL AND KETAL BASED EPOXY OLIGOMERS

(75) Inventors: Stephen Leslie Buchwalter, Hopewell Junction, NY (US); Claudius Feger, Poughkeepsie, NY (US); Gareth Hougham, Ossining, NY (US); Nancy LaBianca, Yalesville, CT (US); Hosadurga Shobha, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 10/310,749

(22) Filed: Dec. 5, 2002

(65) Prior Publication Data

US 2004/0110010 A1 Jun. 10, 2004

(51) Int. Cl.⁷ .................. C07D 303/32; C08G 4/00; C08K 3/36; C08L 59/00; C08L 63/00

(52) U.S. Cl. .................. 528/230; 257/789; 257/793; 428/620; 523/427; 523/445; 523/457; 523/458; 523/466; 525/472; 549/554

(58) Field of Search ................... 257/789, 793; 428/620; 523/427, 445, 457, 458, 466; 525/472; 528/230; 549/554

(56) References Cited

U.S. PATENT DOCUMENTS

| | | | | | |
|---|---|---|---|---|---|
| 3,682,969 | A | * | 8/1972 | Batzer et al. | 549/351 |
| 5,512,613 | A | * | 4/1996 | Afzali-Ardakani et al. | 523/443 |
| 6,258,899 | B1 | * | 7/2001 | Buchwalter et al. | 525/533 |
| 6,617,698 | B2 | * | 9/2003 | Buchwalter et al. | 257/783 |

* cited by examiner

Primary Examiner—Robert Sellers
(74) Attorney, Agent, or Firm—Thomas A. Beck; Daniel P. Morris (57) ABSTRACT

Reworkable thermoset acid-cleavable acetal and ketal based epoxy oligomers can be B-staged into a tack free state. Compositions containing the epoxy oligomers are employed in a reworkable assembly such as a wafer-level underfilled microelectronic package.

23 Claims, 10 Drawing Sheets

Figure 1a : No-Flow underfill process

Figure 1 b : Wafer level underfill process

Figure 1 c : IBM Wafer level underfill process

Figure 2a: Example of a synthesis of an acetal based oligomer

Figure 2b: Examples of acetal based oligomers

Figure 3a: Example of a synthesis of an acetal based co-oligomer

X, Q and R¹ can be any group which are given in Figure 2b

Figure 3b : Generalized structure of acetal co-oligomer

Figure 4a: Example of an epoxidation of an acetal based oligomer

Figure 4b: Examples of epoxy compounds

X, $R^1$ and Q are any groups shown in Figure 2b and $R^3 = R^2$ in Figure 3b

Figure 5: Examples of ketal based oligomers

ACID-CLEAVABLE ACETAL AND KETAL BASED EPOXY OLIGOMERS

FIELD OF THE INVENTION

This invention relates to reworkable thermoset epoxy-containing material that allows for a reworkable assembly, for example a reworkable waferlevel underfilled microelectronic package. The invention also relates to a method using the reworkable thermoset material in the formation of a microelectronic package using this material, and other structures containing the reworkable thermoset epoxy-containing material.

PRIOR ART

Flip Chip technology has grown rapidly in recent years since it allows to decrease chip footprint while simultaneously increasing the number of possible I/O's. This is because flip chip technology takes advantage of the chip area for I/O's instead of just the chip periphery as in wire bonded chips. Various methods exist for solder bumping wafers, such as evaporation, plating, solder paste screening and more recently, injection molded solder, (IMS).

Notwithstanding how the wafers are bumped, the bumped wafers typically are diced in the next step into separate chips. For direct chip attach, (DCA), silicon chips are bonded directly to a laminate substrate. DCA is a rapidly growing packaging technology since it requires the smallest amount of area on the laminate, has the smallest height, and is lighter than other packages. Additionally, flip chip applications provide better electrical characteristics and better cooling than wire bond packaged chips. However, since there is a significant mismatch of the coefficient of thermal expansion (CTE) between the chip silicon and the laminate material, DCA bonded chips must be underfilled with an adhesive support material; underfilling greatly increases the fatigue life of the solder bumps.

However, several manufacturing problems are associated with underfilling.

First, the process adds to the time required to bond each chip. This is due to the fact that the dispensed underfill must flow into the gap between the chip and substrate driven by capillary forces alone. The dispensing operation requires from 30 to 120 seconds depending on the die geometry, bump pattern, standoff, and material characteristics. Upon completion of the underfill operation, batch curing is done requiring an additional amount of time.

Secondly, the distribution of the underfill may be incomplete since the conventional underfill process relies on capillary action to pull the liquid underfill completely under the chip. Since it is difficult to determine underfill uniformity under the chip, partial fills occur which may lead to excess mechanical stress on affected bumps. To avoid this problem, many flip chip packages are 100% inspected by scanning acoustic microscopy, an expensive and slow process.

Thirdly, underfilling adds cost since extra tooling, 0 line space and operator personnel are required.

In order to eliminate these shortcomings several processes have been proposed such as the "no-flow process" and the "waferlevel underfill process." While the no-flow process requires that the underfill material is unfilled, wafer-level underfill processes can be exercised using filled materials.

Figure 1:
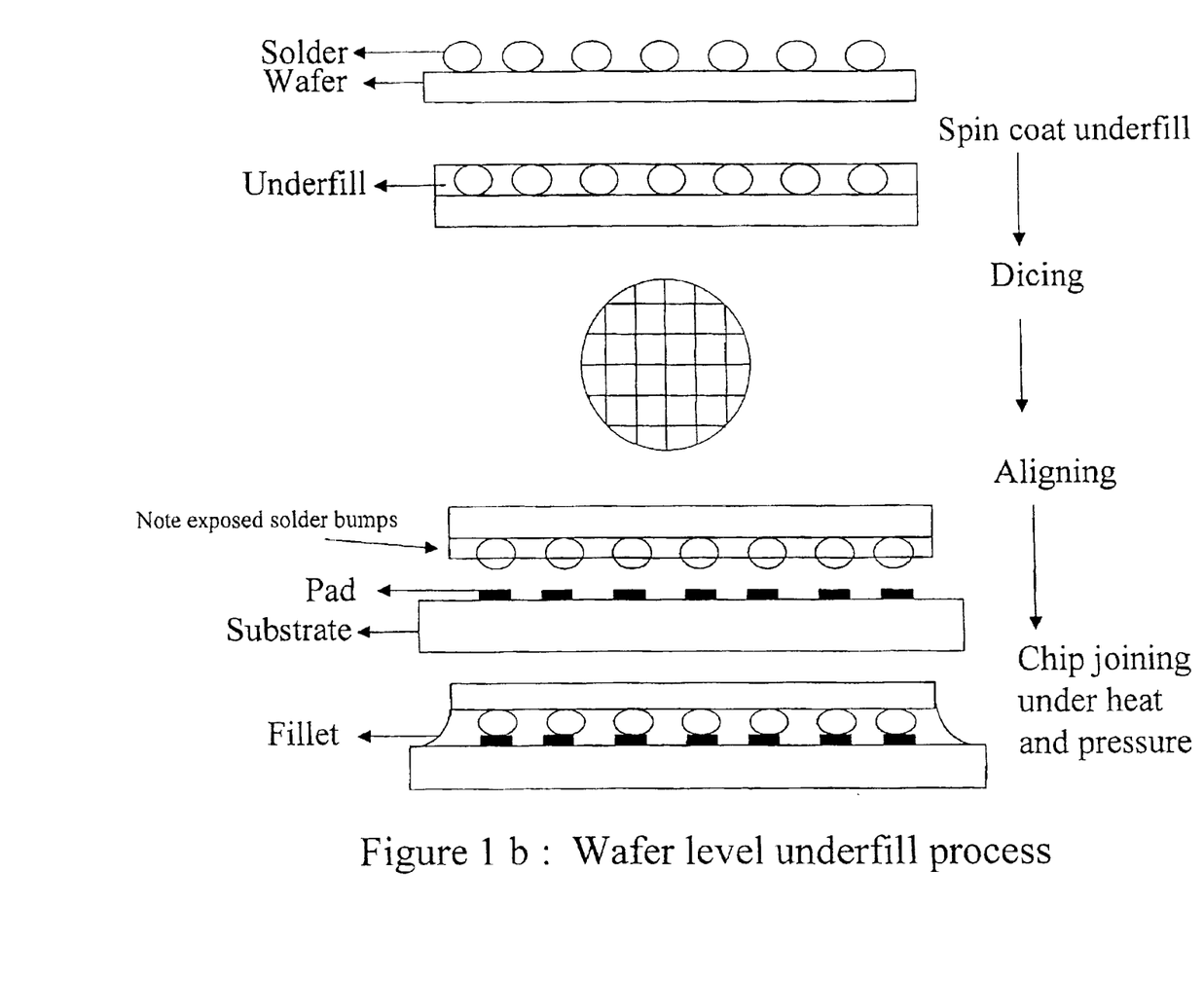
FIG. 1a depicts the prior-art no-flow underfill process.
FIG. 1b depicts the prior-art wafer level underfill process.
FIG. 1c illustrates the IBM Wafer level underfill process.
Figure 1A:
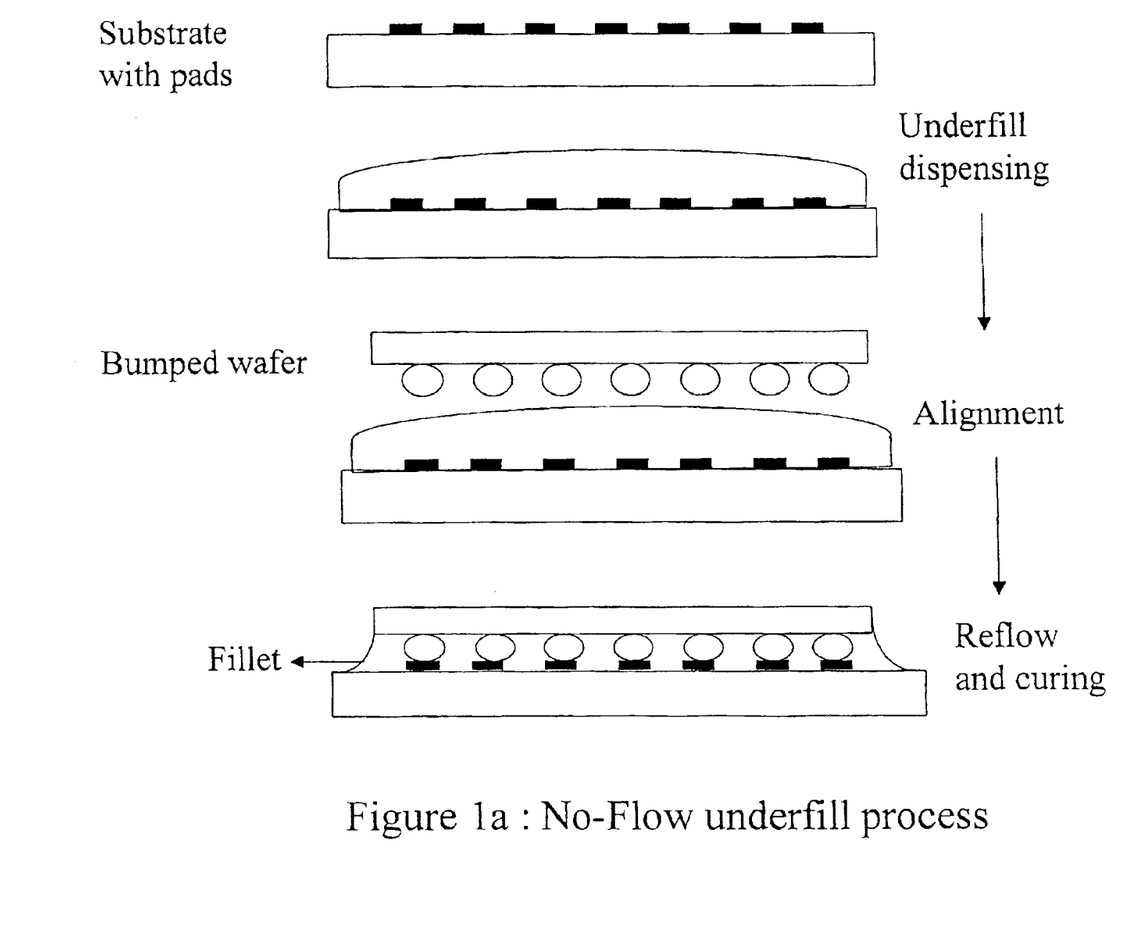

Typical process flows for no-flow and waferlevel underfill are shown in FIGS. 1a and 1b, respectively.

In no-flow underfill (FIG. 1a), the main steps involve dispensing an underfill on a substrate; placing and aligning the chip to the substrate pattern; softening the underfill on the substrate by heating; pushing the aligned bumps through the underfill so that the pads are contacted; and reflowing the solder to make the electrical joint between the chip and substrate. The underfill may or may not require a cure step. This method still requires dispense tooling and individual application of underfill for each chip site. Filled materials have been found not to work in no-flow applications due to the inclusion of particles in the solder joints which lead to electrically inferior and mechanically weak joints.

In conventional waferlevel underfill (FIG. 1b), a filled material is applied to a bumped wafer so that the bumps remain free of the underfill material. This is done mostly by screening the material, or by using a molding process. Spin application followed by laser or plasma etching of the material covering the solder bumps have also been proposed. These application methods are deemed necessary to avoid inclusion of filler particles in the solder joint which is thought to increase electrical resistance and decrease mechanical integrity.

In the next step the underfill on the wafer is "b-staged." In the art, a b-stage resin is a thermosetting resin reacted to a stage where it is hard at room temperature and essentially solvent free but still flows when heated above its b-stage $T_g$. It is a preferred stage for a resin when it is being molded. In the step where the wafer is b-staged, the solvent is removed and the crosslink reaction is advanced to significantly below the gel point with the goal to render the b-staged underfill surface tack free and to impart desired b-stage $T_g$ and flow properties.

In the next step the wafer is diced into underfilled chips. During dicing operation the underfill needs to stay below the $T_g$ so as not to foul or "gum up" the dicing saw. Further the b-staged underfill needs to adhere to the passivation layer of the chip during dicing. The diced chips now can be stored.

In the prior art, epoxy based materials are most widely used as underfills. Epoxy resins are of great importance for a number of diverse applications including coatings, adhesives, structural materials, electrical insulation, encapsulants etc. Epoxy formulations have outstanding properties after curing, including, but not limited to, toughness, adhesion and solvent resistance.

Another attribute of epoxy thermosets is their intractability after curing. This intractability is only another aspect of the chemistry of thermosets, which makes use of a curing reaction to convert low molecular weight precursors to a network polymer of essentially infinite molecular weight. This same property of intractability of thermosets, however, is a liability since it prohibits rework or at least makes it very difficult. If expensive chips or substrates are being used, the inability to rework is not acceptable since one defective part would render the whole assembly useless.

Another concern is the longevity of thermosets in the environment. Already many manufacturers are taking responsibility for disposal or recycling of their products, and others are being required to do so by government regulation. As part of this trend, the concept of design for disassembly is one that is gaining in favor. Intractable thermosets are not compatible with this concept, whether they are used as structural components, adhesives, or encapsulants. If, however, the thermoset itself is designed for controlled disassembly on the molecular scale, it is possible that many advantages of thermosets can be retained without the disadvantage of intractability.

In underfills, thermosets act as adhesives effectively gluing components to a substrate and encapsulating the electrical connections between flip chip and said substrate. If a substrate holds more than one underfilled component as in high performance Multi Chip Modules (MCMs) and Flip-chip-on-Board (FCOB) applications, the inability to disassemble or "rework" a defective underfilled component can become very expensive since the whole package will become useless. A rework process for such attached chips is highly desirable.

Thermoset adhesive connections can be broken by heating an assembly above the glass transition and applying force. While this is not a desirable process, it is a possibility. However, the site of the original, adhering, defective component, such as a flip chip, needs to be cleaned to receive a new, working component. This site clean operation remains still the major roadblock to successful rework of thermoset underfilled chips.

Buchwalter, et al. developed diepoxides with acid-cleavable acetal groups. This approach works well with respect to the clean-up aspect of residue removal and preparation of the site in the reworkable process. However, the materials proposed in Buchwalter, et al.'s prior art disclosures are of the conventional underfill type, which carry with it the problems outlined above.

There are also reports on thermally reworkable underfill. This approach involves high temperature and harsh mechanical processes to clean the site. Another approach is to use thermoplastic as an encapsulant but the thermoplastic material requires high temperature to melt and long exposure to solvent in order to dissolve the polymer. The use of reworkable epoxies and epoxy formulations is of course not restricted to underfill applications but they can be used in all applications where epoxies and their formulations are used.

Some other pertinent disclosures relating to diepoxides and their uses in such applications as waferlevel underfill are found the following references, the contents of which are incorporated by reference herein: U.S. Pat. No. 5,512,613 to Ali Afzali-Ardakani, S. L. Buchwalter, et al., "Cleavable Diepoxide for Removable Epoxy Compositions"; U.S. Pat. No. 5,560,934 to Buchwalter, et al., "Cleavable Diepoxide for Removable Epoxy Compositions"; U.S. Pat. No. 6,258,899 to S. L. Buchwalter, et al., "Cleavable Acetal-containing Diepoxide and Anhydride Curing Agent for Removable Epoxy Compositions"; S. L. Buchwalter and L. L. Kosbar, "Cleavable Epoxy Resins: Design for Disassembly of Thermoset," J. Polym. Sci., Part A: Polym Chem., Vol. 34, P. 249 (1996); S. L. Buchwalter, A. J. Call, et al., "Reworkable Epoxy Underfill for Flip-Chip Packaging," First International Symposium on Advanced Packaging Materials, Process, Properties, and Interfaces, ISHM, February P. 7 (1995); J. Rudolph, K. Laxma Reddy, J. P. Chiang, and K. Barry Sharpless "Highly Efficient Epoxidation of Olefins Using Aqueous $H_2O_2$ and Catalytic Methyltrioxorhenium/Pyridine: Pyridine-Mediated Ligand Acceleration" J.Am..Chem. Soc. 119, 6189, 1997; L. Wang, H. Li, C. P. Wong, "Synthesis and Characterizations of Thermally Reworkable Epoxy Resins II", J. Polym. Sci., Part A: Polym Chem., Vol. 38, No. 20, P. 3771 (2000). R. Mahidhara, "Comparing Chip-Scale Packaging to Direct Chip Attach," ChipScale, May–June, 1999.

In view of the above problems associated with prior art methods of fabricating underfilled microelectronic interconnect structures, there is a need for developing a reworkable thermoset material so that parts attached to the thermoset adhesive can be reused after cleaning the thermoset residue. Moreover, a new and improved method of fabricating microelectronic interconnect structures is needed which substantially eliminates the separate, time consuming, expensive underfill processes which are presently being carried out to fabricate the same.

SUMMARY OF THE INVENTION

One object of the present invention is to develop reworkable thermoset materials, which can be cleaved using a solvent. This rework process facilitates thermoset residue removal and site cleaning so that expensive parts can be adhered to expensive substrates and, if needed, removed, cleaned and reused.

A further object of the present invention is to provide a method of fabricating a reworkable microelectronic structure by spin coating a formulation containing a filler and a reworkable thermoset onto a wafer to use in a modified wafer level underfill process.

Figure 2A:
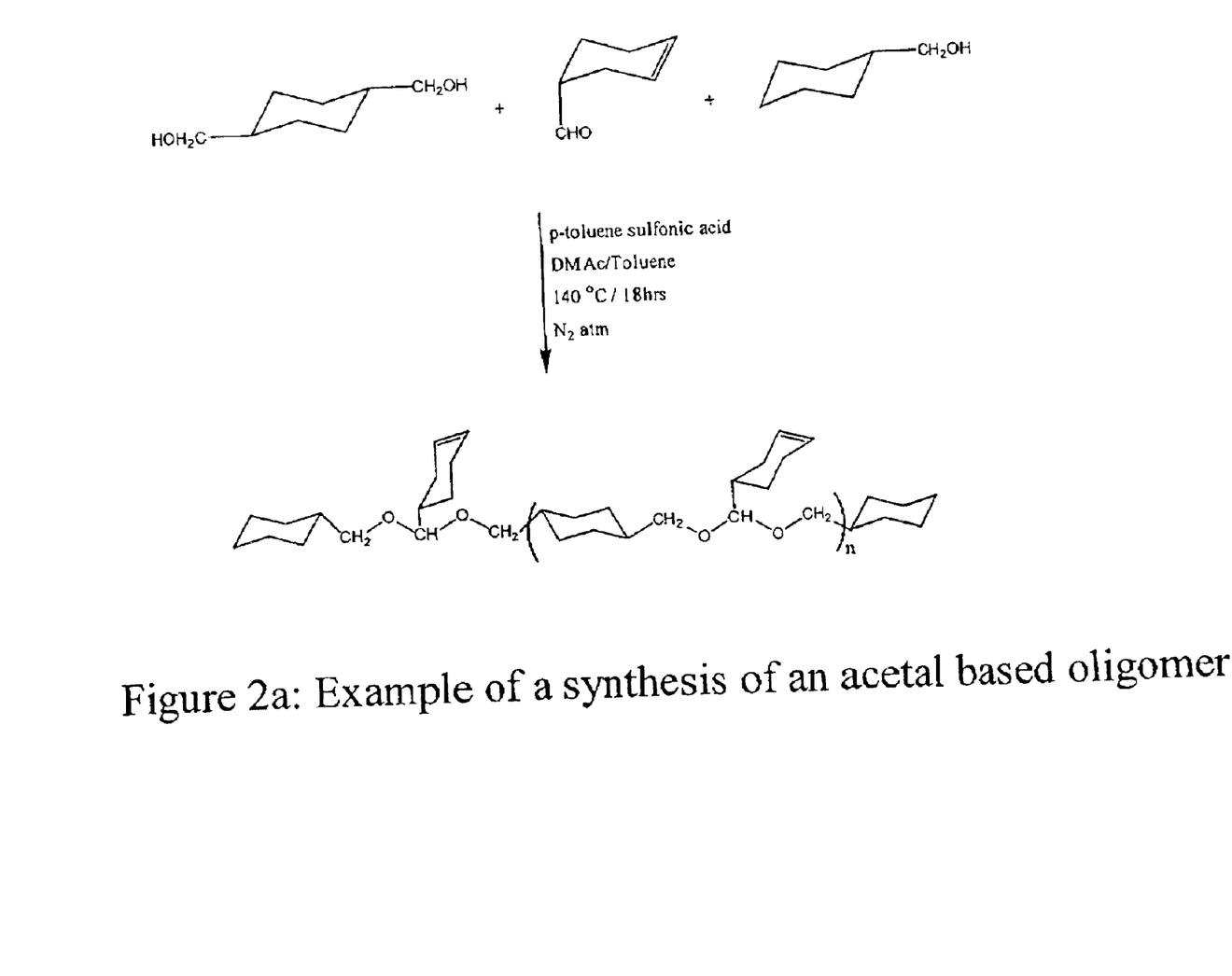
FIG. 2a is a schematic of the synthesis of an acetal based oligomer.
Figure 2B:
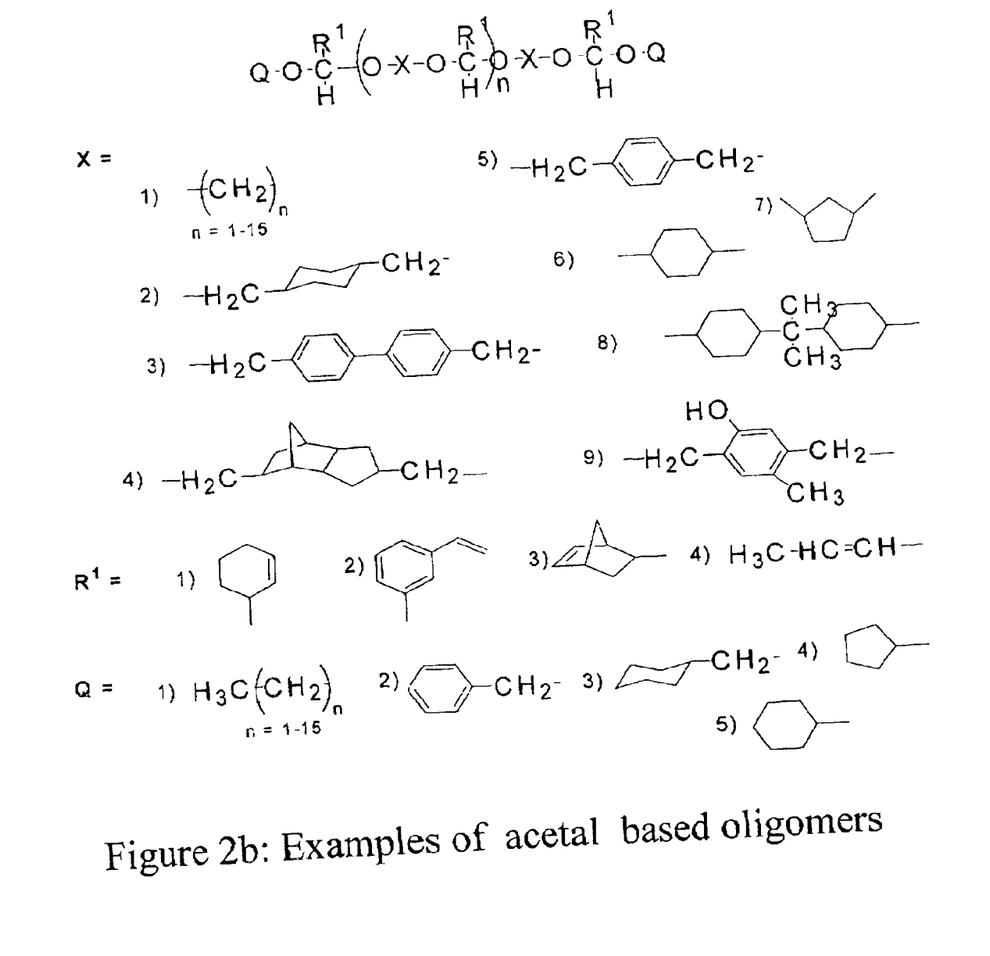
FIG. 2b is a schematic of examples of acetal based oligomer.
Figure 3A:
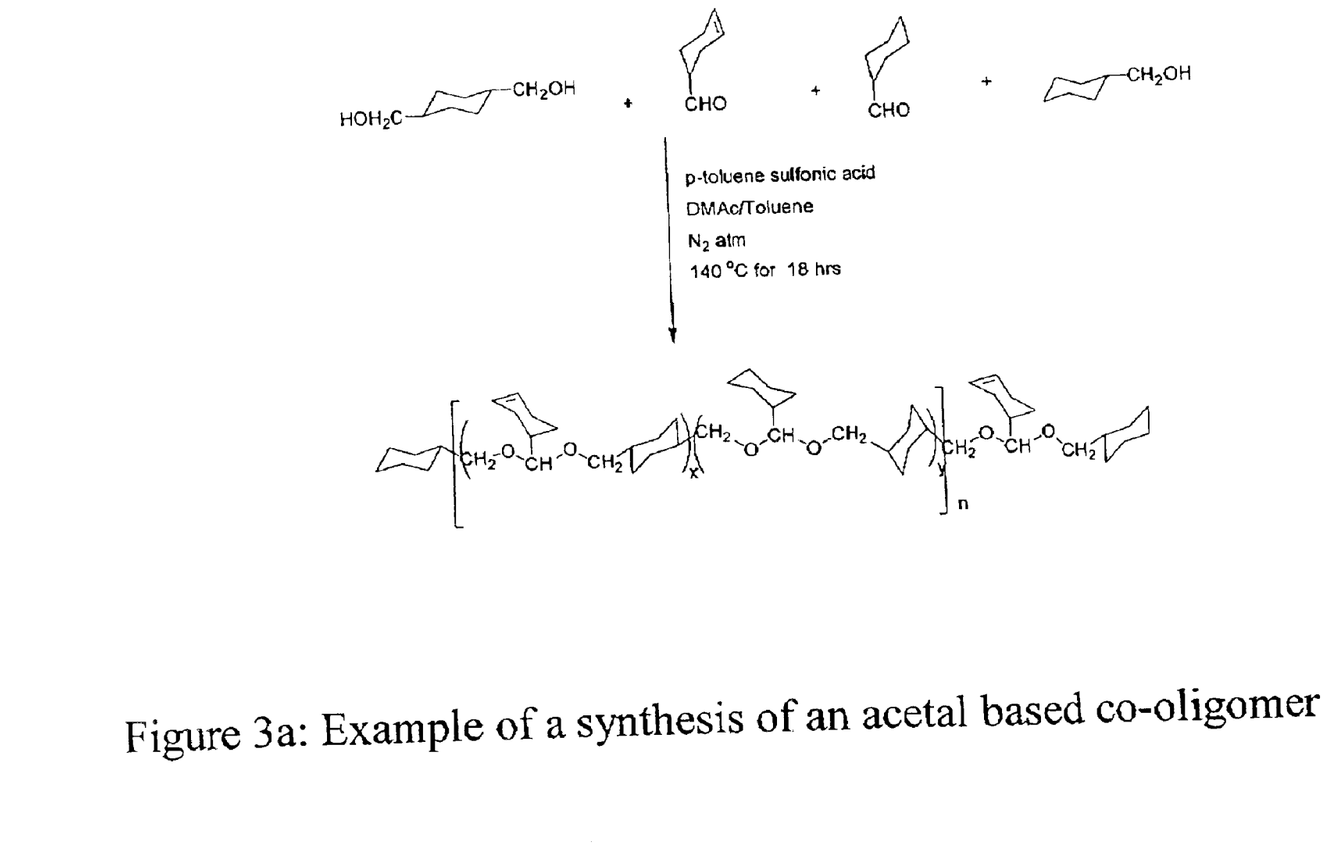
FIG. 3a is a schematic of the synthesis of an acetal based co-oligomer.
Figure 3B:
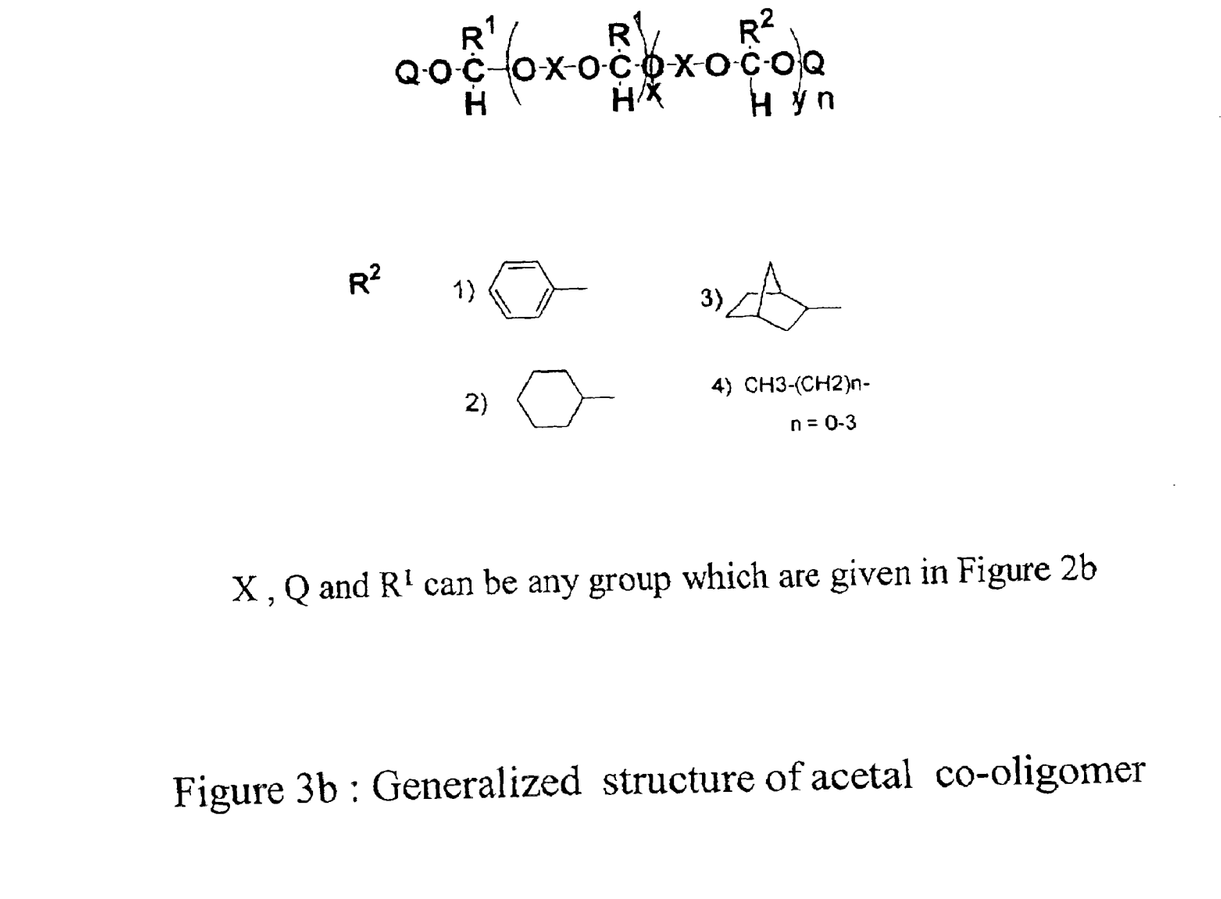
FIG. 3b is a schematic of examples of an acetal based co-oligomer.

In the present invention, b-stageable, reworkable thermoset materials have been developed by introducing a cleavable acetal group [e.g., $—CH_2O—CHR^1—OCH_2—$] or a ketal [(e.g., $—CH_2O—CR^1R^2—OCH_2—$] [$R^1$ and $R^2$ groups can be varied as shown in FIGS. 2b and 3b] group into epoxy oligomers and/or co-oligomers. The b-stage $T_g$ of the epoxy oligomers can be varied by controlling the molecular weight of the oligomers or by using co-monomers. The cured thermoset network cleaves in acid solutions.

The invention also comprises a formulation of the reworkable epoxy oligomer, a filler and with or without solvent. The fully cured composite retains the reworkability character.

DETAILED DESCRIPTION OF THE INVENTION

Figure 1C:
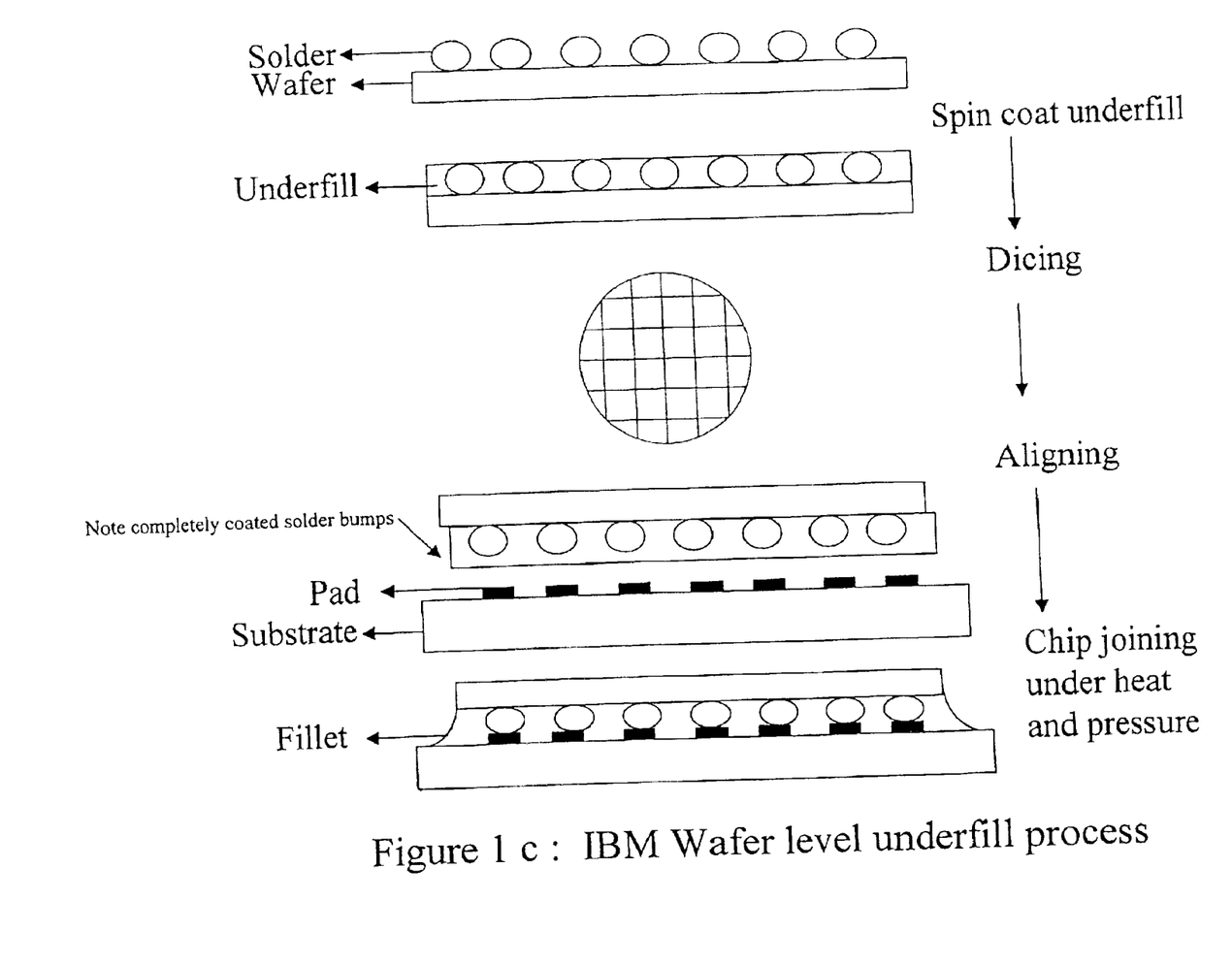

The present invention concerns reworkable, waferlevel underfill materials and a new process. FIG. 1c illustrates the IBM Wafer level underfill process. Acid-cleavable groups are introduced in epoxy oligomers. This invention provides chemical structures and procedures for the synthesis of said structures of acetal and ketal based epoxy oligomers.

FIG. 2a depicts an example of the typical synthesis of an acetal based oligomer wherein, for the purposes of the present invention, n is 6. The reactants, the catalysts, the time of reaction, temperature and atmosphere are illustrative and can vary, with the essential requirement that an acetal based oligomer be formed. Specific examples of such acetal based oligomers are illustrated in FIG. 2b.

FIG. 3a depicts an example of a synthesis of an acetal based co-oligomer, wherein for the purposes of the present invention, x is 3 to 4; y is 3 to 4; and n is 3 to 4. In this case also, the reactants, the catalysts, the time of reaction, temperature and atmosphere can vary, with the essential requirement that a stable acetal based co-oligomer be formed. Specific examples of such acetal based co-oligomers are given in FIG. 3b.

The present invention also provides processes to accomplish cleaving of the cured thermoset network describing special solvents suitable for this purpose. The invention describes further formulations of said epoxy oligomer with fillers and other additives such as solvents which can be used as waferlevel underfills. These formulations can be spin coated onto wafers to exercise a modified waferlevel underfill process.

Figure 4A:
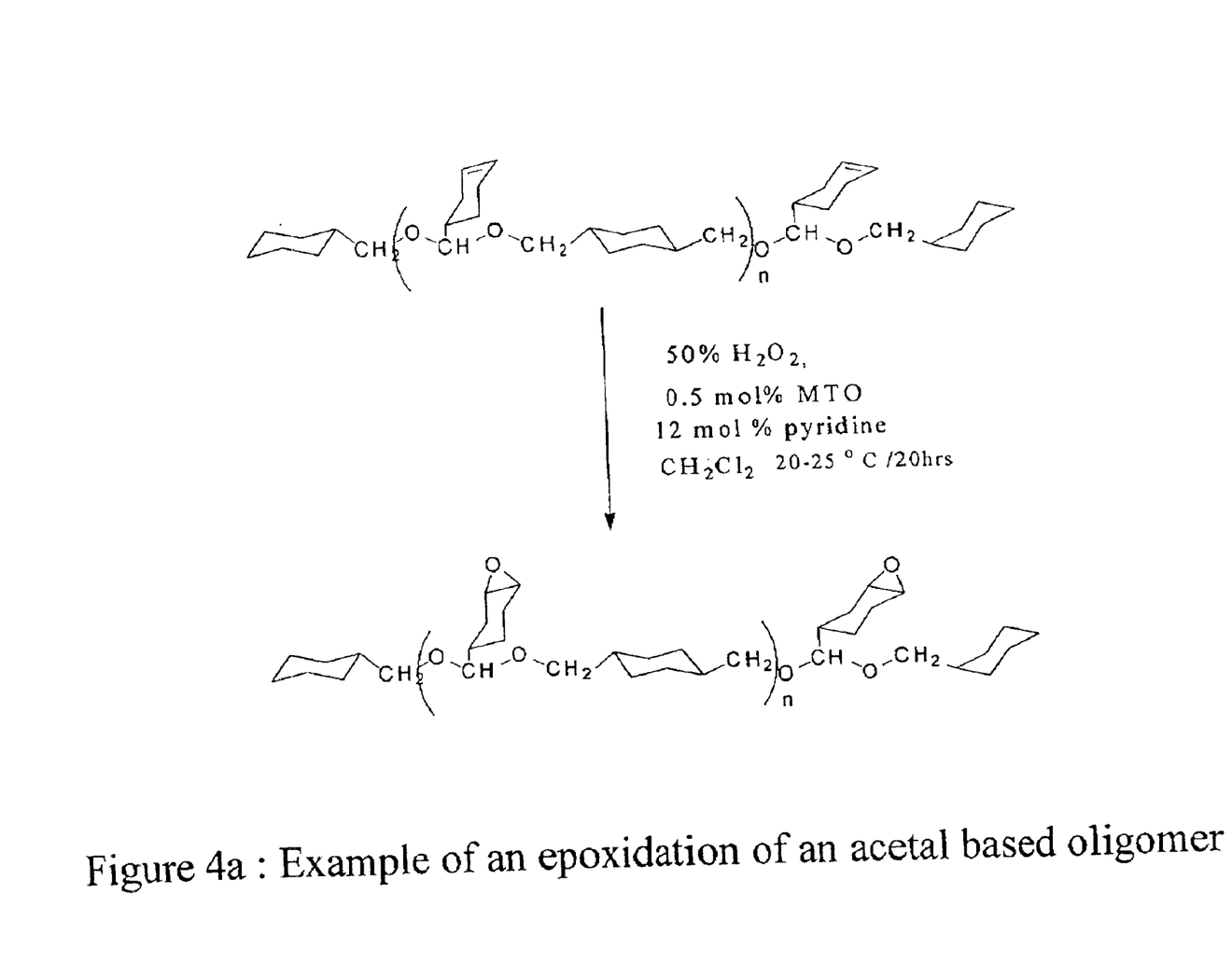
FIG. 4a is a schematic of the epoxidation of an acetal based oligomer.
Figure 4B:
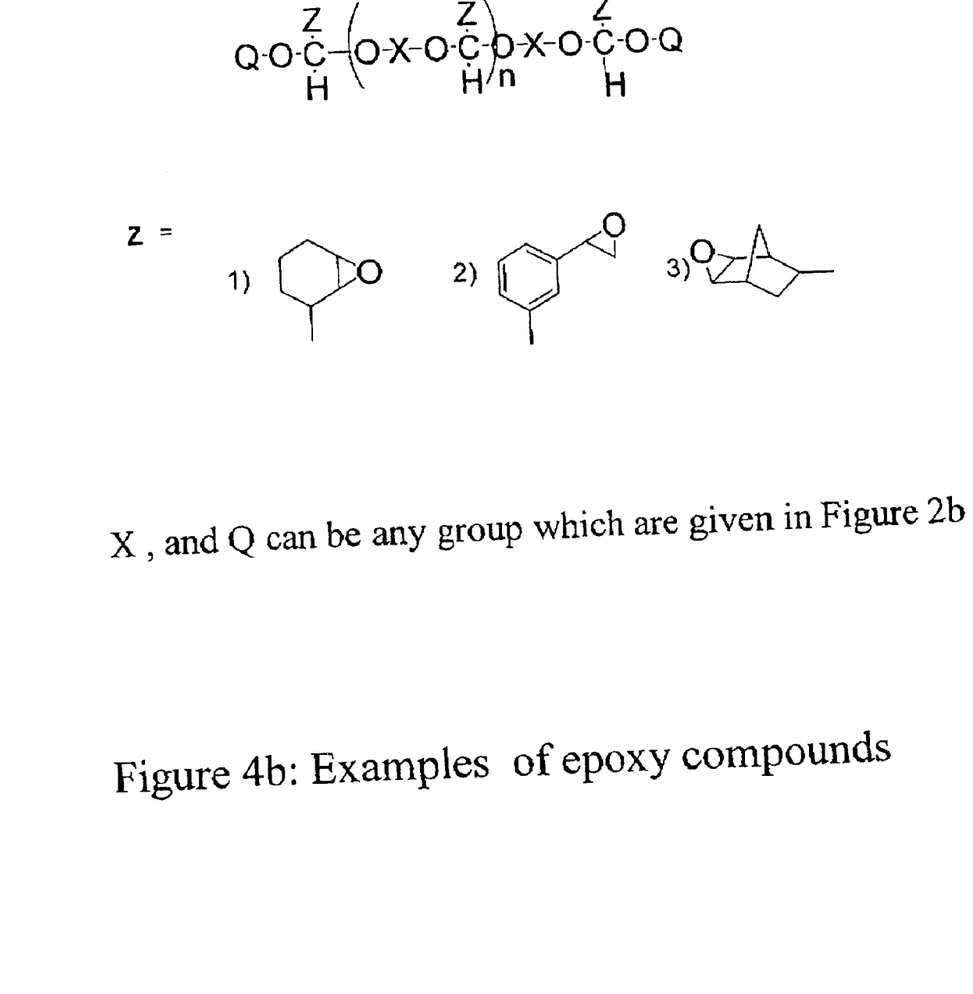
FIG. 4b is a schematic of examples of epoxy compounds.
Figure 5:
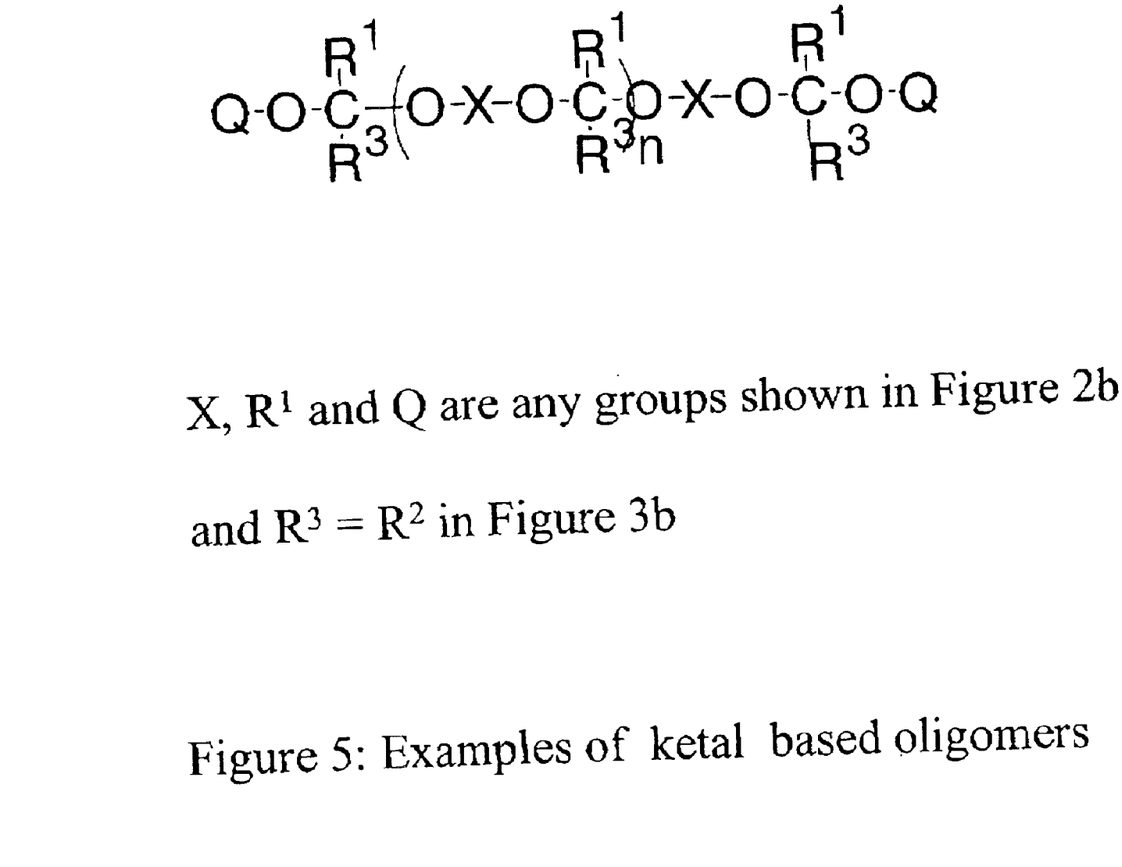
FIG. 5 is a schematic of examples of ketal based oligomer.

FIG. 4a shows a typical example of an epoxidation of an acetal based polymer. Examples of epoxy compounds that can be used in accordance with the present invention are depicted in FIG. 4b.

Acids used to cleave the cured thermoset network are: suitable acids include organic acids such as acetic acid, propionic acid, chloroacetic acid, benzoic acid and the like; sulfonic acids such as benzenesulfonic acid, p-toluene sulfonic acid, methane sulfonic acid and the like; and lewis acids such as boron trifluoride etherate, aluminum chloride, stannic chloride and the like.

Fillers used in the formulation are present in an amount between about 5% and 75% by weight, preferably between about 30% and 65% by weight, and can be any of the powdered solids known in the art including ceramic particles, such as alumina, silica, zinc oxide, BN, talc, titanium oxide, metals such as Al, Ag, Cu and any nanosized filler particle types, including silica, $TiO_2$, clay, etc.

The present invention also utilizes epoxy-containing monomers (distinct from the oligomers) which serve as reactive diluents. These reactive diluent monomers are different from those precursor monomers used to form the oligomers used in accordance with the present invention. The epoxy-containing monomers which may be conveniently used as reactive diluents in accordance with the present invention include aromatic epoxies, aromatic diepoxies, aromatic cleavable epoxies, imide-containing epoxies, imide-containing diepoxies, imide-containing cleavable epoxies, aliphatic epoxies, aliphatic diepoxies, aliphatic cleavable epoxies, cycloaliphatic epoxies, cycloaliphatic diepoxies and cycloaliphatic cleavable epoxies. The function and method of using these monomeric epoxies is described in detail in Example 5 herein.

The following examples are given by way of illustration with the understanding that any of the individual compounds listed above can utilized for those disclosed in the methods presented.

EXAMPLE 1

This example discloses the preparation of an acetal oligomer: Cyclohexane dimethanol was reacted with tetrahydrobenzaldehyde and cyclohexyl methanol was used as an endcapper as shown in FIG. 2a.

In a 250 ml three necked flask fitted with a mechanical stirrer, $N_2$ inlet and outlet adapters, thermometer, Dean-Stark trap, and water condenser, 26.07 g (0.1807 mol) of cyclohexane dimethanol, 22.71 g (0.2062 mol) of tetrahydrobenzaldehyde, and 5.79 g (0.0507 mol) of cyclohexyl methanol were combined. 0.45 g of p-toluene sulfonic acid was used as a catalyst. To the above mixture, 50 ml of dimethyl acetamide and 30 ml of toluene as an azeotropic solvent was added. The reaction mixture was heated to 140° C. in an oil bath for a 18 hrs. The water evolved during the reaction was removed in a Dean-Stark trap to drive the reaction to completion. After this reaction was complete, the toluene was boiled off and the reaction was allowed to continue for another 2 hrs. A viscous solution was obtained. The reaction mixture was cooled to room temperature, and the polymer was precipitated in a 75:25 water(basic) :methanol mixture. A gummy polymer was obtained. The polymer was redissolved in dichloromethane, washed twice with $NaHCO_3$ solution, and dried by passing through anhydrous sodium sulfate. The polymer solution was concentrated in a rotavap and then precipitated in methanol. A gummy polymer was obtained and was dried in a vacuum oven at 90° C. overnight. This resulted in a glassy polymer. The yield was ~85%. The acetal oligomer was characterized by IR and NMR spectroscopic techniques. Although cyclohexane dimethanol was reacted with tetrahydrobenzaldehyde and cyclohexyl methanol used as an endcapper in accordance with this example, other compounds disclosed in FIG. 2a give equally efficient results.

EXAMPLE 2

The schematic of the synthesis of a co-oligomer is shown in FIG. 3a. The synthesis of the co-oligomer was carried out similar to that of the oligomer discussed above. However, cyclohexane carboxaldehyde was used as a co-monomer. In the above scheme, the concentration of tetahydrobenzaldehyde to cyclohexane carboxaldehyde can be varied to tune the cured material properties. The monomer and co-monomer can also be changed. In general, the dialcohol and aldehydes can be changed in acetal oligomer synthesis as shown in FIG. 3b. The dialcohol can be aliphatic, aromatic or cyclic and aldehyde can be cyclic aliphatic or aromatic or any group illustrated in FIG. 3b. Unsaturated aldehyde can be used for epoxidation reaction. Aliphatic, aromatic or any other mono alcoholic group in FIG. 3b can be used for controlling the molecular weight of the oligomer.

EXAMPLE 3

Epoxidation of the acetal oligomer: The epoxidation was carried out by adopting the literature procedure (J. Rudolph, K. Laxma Reddy, J. P. Chiang, and K. Barry Sharpless J. Am. Chem. Soc. 119, 6189, 1997) as shown in FIG. 4a.

In a 250 ml three necked flask fitted with a mechanical stirrer, $N_2$ inlet and outlet adapters, thermometer, and an addition funnel, 35 g (0.1494 mol) of acetal oligomer was dissolved in 200 ml of dichloromethane. To this, 1.45 ml of pyridine (0.01793 ml) and 0.1862 g (0.00075 mol) of methyl trioxorhenium was added as a catalyst. The reaction flask was cooled in an ice mixture. Exactly 25.6 ml (0.445 mol) of 50% hydrogen peroxide was added drop wise from an addition funnel so that the temperature of the reaction mixture did not raise to more than 5° C. After completed addition, the reaction was allowed to continue to stir at room temperature for 24 hrs. After the reaction, the aqueous phase was separated and discarded. The remaining $H_2O_2$ in the organic phase was decomposed to $O_2$ and $H_2O$ by stirring with a catalytic amount of manganese dioxide (25 mg) until the color changed from yellow to colorless. The polymer solution was washed twice with $NaHCO_3$ solution and dried by passing through anhydrous sodium sulfate. The polymer solution was concentrated in a rotary evaporator and then precipitated in methanol. A gummy polymer was obtained. It was dried in a vacuum oven at 60° C. overnight. This resulted in a glassy polymer. The yield was ~55%. The polymer was analyzed by IR and NMR spectroscopic techniques. Epoxy Equivalent was 290 (theoretical 252).

EXAMPLE 4

Epoxidation of the acetal co-oligomer: The epoxidation was carried out using the same procedure which was used in Example 3.

EXAMPLE 5

Epoxy Formulation and Spin Coating: The epoxy oligomer was mixed with hardener, catalyst, silica filler. Solvent was added to adjust the viscosity of the formulation for spin coating. Solvent content in the formulation can be reduced by adding mono or diepoxide reactive diluents in place of solvent. Reactive diluents reduce solvent by first acting to modify the viscosity during spin application (as would a solvent) but then (unlike solvent) becomes immobilized in the network structure by reaction during final cure. Diepoxide reactive diluents perform the additional function of modifying the network density and the final properties after curing. The reactive diluent can, for instance, be phenyl glycidyl ether (a mono epoxide) or bisphenol A diglycidyl ether (a diepoxide), 3,4-epoxycyclohexylmethyl 3,4-epoxycyclohexanecarboxylate (another diepoxide), or a cleavable diepoxide of a type described in the prior art by Buchwalter et.at. Inclusion of cleavable diepoxide as an example of a reactive diluent is a matter of semantics because in this case this small molecule performs three functions: It lowers the viscosity because it is small relative to the large and viscous oligomers, it increases the network density because it is multifuncional and short, and additionally increases the density of acid cleavable groups in the network. The formulation was mixed well, degassed and kept in a freezer at −40° C. To use it was thawed to room temperature and spin coated on a wafer under conditions leading to the required film thickness, i.e., so that the underfill film covers the solder bumps to a desired extent. The formulation was spin coated onto a silicon wafer followed by b-stage curing to get a tack free surface and the desired b-stage Tg, flow, and storage shelf life properties. The wafer is then diced to form discrete chips. The chips can optionally be briefly heated above the Tg on a hot surface to allow the underfill to form a slight convex shape over the chip area which gives certain advantages during joining by reducing the entrapment of air. It also improves visual transparency near the edges where alignment marks can be located. The chip can then be placed, aligned, and joined to the substrate.

EXAMPLE 6

Proof of Reworkability: The epoxy oligomer was mixed with hardener and catalyst. The mixture was then spotted onto glass slides forming dots of ~1 cm diameter and cured in an oven at 150° C. for 2 hrs. This treatment fully cured the material of said spots into a hard, crosslinked tack free solid, as expected for a thermoset. The cured epoxy was dissolved in a methane sulfonic acid/trifluroethanol (3.2 g/100 ml ) mixture at 80° C. The cured samples dissolved within 4–6 minutes, demonstrating the cleavability and thus the reworkability.

The molecular weight of the oligomers and co-oligomers as used in the present invention is around 2000.

Applicants have determined that the compositions embodied within the scope of the present invention may be blended with thermoplastic polymers to increase the impact performance of the thermoset. Thermoplastics such as polyethylene, polypropylene, polybutene, polysulfone, polycarbonate, polyesters, etc. and any of the other well known thermoplastic polymers that modify impact properties may be used. U.S. Pat. No. 6,225,373 to Hedrick, the contents of which are incorporated by reference herein discloses modifying an epoxy system with a thermoplastic polymer.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What we claim and desire to protect by Letters Patent is:

1. A reworkable thermoset which can be b-staged into a tack free state and which softens considerably during heating before final cure comprising:

an epoxy-containing oligomer having the formula:

wherein X is the same or different, and is selected from the group consisting of:

-continued

9)

at least one R¹ must be a cleavable epoxy, and if more than one, may be the same or different, and said R¹ being selected from the group consisting of:

R¹ =

1)

2)

3)

4) H₃C—HC=CH— and any R¹ which is not an epoxy, may be a precursor to said epoxies and may be the same or different, said R¹ is selected from the group consisting of:

1)

2)

3)

Q is selected from the group consisting of:

1) H₃C—(CH₂)ₙ— n = 1–15

-continued

2)

3)

4)

5)

and n is 1 to 6 said epoxy groups, in said epoxy-containing oligomer, after said epoxy-containing oligomer is cured, being cleavable using an acid selected from the group consisting of an organic acid and a Lewis acid.

2. The thermoset defined in claim 1 comprising a mixture of said oligomers having different X, R¹ and Q groups.

3. The thermoset defined in claim 1 wherein a moiety which is cleavable is an acetal group.

4. The thermoset defined in claim 1 wherein a moiety which is cleavable is a ketal group.

5. The thermoset defined in claim 1 which contains chemically cleavable groups selected from the group consisting of acetal and ketal groups.

6. A formulation comprising the thermoset defined in claim 1 in admixture with a between about 5% and 75% by weight of a filler.

7. A formulation comprising the thermoset defined in claim 1 in admixture with between about 0.2% and 5% by weight of a flux.

8. A formulation comprising the thermoset defined in claim 1 in admixture with a plurality of different fluxes.

9. A formulation comprising the thermoset defined in claim 1 in admixture with a catalyst.

10. A formulation comprising the thermoset defined in claim 1 in admixture with a plurality of different catalysts.

11. A structure obtained by b-staging to a tack free surface the formulation defined in claim 1 on a circuitized and bumped wafer.

12. The b-staged chip structure defined in claim 11 obtained by dicing said wafer.

13. A reworkable assembly comprising the structure defined in claim 11 joined to another electronic element.

14. A reworkable package obtained by joining said chip defined in claim 12 to an electronic substrate.

15. The reworkable package defined in claim 14 wherein said substrate is an organic laminate.

16. The formulation defined in claim 6 comprising the thermoset defined in claim 1 in admixture with a between about 30% and 65% by weight of a filler.

17. The formulation comprising the thermoset defined in claim 7 in admixture with between about 1.5% and 2.5% by weight of a flux.

18. The reworkable thermoset defined in claim 1 wherein said organic acid is selected from the group consisting of acetic acid, propionic acid, chloroacetic acid, benzoic acid, benzenesulfonic acid, p-toluene sulfonic acid, methane sulfonic acid.

19. The reworkable thermoset defined in claim 1 wherein said Lewis acid is selected from the group consisting of boron trifluoride etherate, aluminum chloride, stannic chloride.

20. The formulation defined in claim 6 wherein said filler is selected from the group consisting of ceramic particles, metals and nano particles with good optical properties.

21. The formulation defined in claim 20 wherein said filler is a ceramic particle selected from the group consisting of $SiO_2$, BN, alumina, $TiO_2$ and talc.

22. The formulation defined in claim 20 wherein said filler is a metal selected from the group consisting of Al, Ag and Cu.

23. The formulation defined in claim 20 wherein said filler is a nano particle with good optical properties selected from the group consisting of $SiO_2$, clay, and $TiO_2$.

* * * * *